US006729923B2

(12) United States Patent
Ahn et al.

(10) Patent No.: US 6,729,923 B2
(45) Date of Patent: May 4, 2004

(54) FIELD EMISSION DEVICE AND METHOD OF FABRICATING THE SAME

(75) Inventors: Seong Deok Ahn, Daejon-Shi (KR); Jin Ho Lee, Daejon-Shi (KR); Kyoung Ik Cho, Daejon-Shi (KR)

(73) Assignee: Electronics and Telecommunications Research Institute, Daejon-Shi (KR)

(*) Notice: Subject to any disclaimer, the term of this patent is extended or adjusted under 35 U.S.C. 154(b) by 0 days.

(21) Appl. No.: 10/160,413

(22) Filed: May 30, 2002

(65) Prior Publication Data

US 2003/0122466 A1 Jul. 3, 2003

(30) Foreign Application Priority Data

Dec. 28, 2001 (KR) ........................................ 2001-86836

(51) Int. Cl.[7] ................................................ H01L 21/00
(52) U.S. Cl. .............................. 445/24; 438/20; 427/77
(58) Field of Search .............................. 445/24, 49–51; 427/77–78; 438/20, 945, 974, 976, 769, 770

(56) References Cited

U.S. PATENT DOCUMENTS 3,755,704 A 8/1973 Spindt et al.
5,583,393 A * 12/1996 Jones .......................... 313/495
5,910,701 A * 6/1999 Takemura .................... 313/309
5,965,972 A * 10/1999 Takada et al. .............. 313/309
5,973,444 A * 10/1999 Xu et al. ..................... 313/309
6,031,322 A * 2/2000 Takemura et al. .......... 313/309
6,057,172 A * 5/2000 Tomihari ...................... 438/20
6,146,227 A 11/2000 Mancevski
6,187,603 B1 * 2/2001 Haven et al. ................. 438/20
6,278,231 B1 * 8/2001 Iwasaki et al. ............. 313/310
6,369,496 B1 * 4/2002 Yoshiki ....................... 313/309
6,422,906 B1 * 7/2002 Hofmann et al. ............. 445/24
6,482,575 B2 * 11/2002 Tokai et al. ................ 430/321
6,574,130 B2 * 6/2003 Segal et al. ................. 365/129

FOREIGN PATENT DOCUMENTS

KR 2001-39123 5/2001

* cited by examiner

*Primary Examiner*—Sandra O'Shea
*Assistant Examiner*—Dalei Dong
(74) *Attorney, Agent, or Firm*—Blakely, Sokoloff, Taylor & Zafman

(57) ABSTRACT

The present invention relates to a field emission device and a method of fabricating the same. The method includes forming a hole having a nanometer size using silicon semiconductor process and then forming an emitter within the hole to form a field emission device. Therefore, the present invention can reduce the driving voltage and thus lower the power consumption.

14 Claims, 5 Drawing Sheets

FIELD EMISSION DEVICE AND METHOD OF FABRICATING THE SAME

BACKGROUND OF THE INVENTION

1. Field of the Invention

The present invention relates generally to a field emission device having an emitter formed in a nano hole, and more particularly to a field emission device and a method of fabricating the same which can lower the operating voltage to reduce the power consumption.

2. Description of the Prior Art

Field emission devices employ a phenomenon that electrons are emitted from a part of the emitter when a voltage is applied between the emitter and a gate electrode. The field emission devices are applied to microwave devices or field emission displays (FED).

Generally, the field emission device is divided into a diode-type having an upper plate and a lower plate used as an emitter and a cathode, and a triode-type having a gate formed around an emitter for supplying a voltage.

As the diode-type has a high operating voltage and is difficult to control the amount of electron emission, the triode-type is usually employed. In particular, a spindle type emitter is widely used.

The spindle type emitter has a fine tip of a cylindrical shape and emits electrons when a high electric field is applied to an end of the fine tip. Thus, as the operating characteristic of the spindle type emitter is stable, it has been most widely used as an emitter of the triode-type field emission device. Further, a lot of researches on the shape and material of the tip have been actively made.

As the field emission device having this spindle type emitter, however, is driven with a high voltage of about 50V~100V, it has a high consumption voltage. Thus, it is required that the voltage be further lowered in order to commercialize the field emission device using the spindle type emitter.

In order to fabricate a field emission device driven with a low voltage, an aspect ratio of the emitter must be increased. Therefore, a research on manufacturing the emitter using carbon nanotube has recently been made.

FIG. 1 is a cross-sectional view of a conventional field emission device.

Referring now to FIG. 1, an emitter electrode 12 made of metal is formed on a silicon substrate 11. An insulating layer 15 having an aperture 15*a* is formed on the emitter electrode 12. A catalyst layer 13 made of a transition metal is formed on the emitter electrode 12 exposed through the aperture 15*a*. An emitter 14 is formed on the catalyst layer 13. A gate electrode 16 having a given pattern is formed on the insulating layer 15. The transition metal includes carbon nanotube, a nano grain film and a metal tip.

At this time, the emitter 14 composed of a metal tip may be formed right on the emitter electrode 12 exposed through the aperture 15*a* without the catalyst layer 13.

If an operating voltage is applied to the emitter electrode 12 and the gate electrode 16, respectively, a high electric field is formed around the emitter 14. Due to this, electrons are emitted from the emitter 14.

Meanwhile, in order to fabricate the field emission device driven with a low voltage, it is required that the aspect ratio of the emitter be increased. The aspect ratio of the emitter can be increased by a formation of a hole having a nanometer size. The hole having a nanometer size should be formed in anodized aluminum oxide layer since the hole can not be formed in conventional oxide layer. However, anodized aluminum oxide is not suitable for the semiconductor manufacturing process. Therefore, it is difficult to manufacture the emitter having a large aspect ratio by using the conventional method.

SUMMARY OF THE INVENTION

The present invention is contrived to solve the above problems and an object of the present invention is to provide a field emission device and a method of fabricating the same, capable of reducing the driving voltage and thus lower the power consumption, in such as way that a hole having a nanometer size is formed by processes of manufacturing the semiconductor devices and an emitter is then formed in the hole to increase the aspect ratio of the emitter.

In order to accomplish the above object, a field emission device according to the present invention, is characterized in that it comprises a silicon substrate having an emitter electrode formed in a surface portion thereof; an insulating layer formed on the emitter electrode and having a nano hole to expose the emitter electrode; an emitter formed on the emitter electrode exposed through the nano hole; and a gate electrode formed on the insulating layer.

A method of fabricating a field emission device according to the present invention is characterized in that it comprises the steps of forming silicon rods on a silicon substrate; forming an emitter electrode within the silicon substrate; forming insulating layer between the silicon rods; forming a gate electrode on the insulating layer; forming a nano hole in the insulating layer by removing the silicon rods; and forming an emitter on the emitter electrode exposed through the nano hole.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
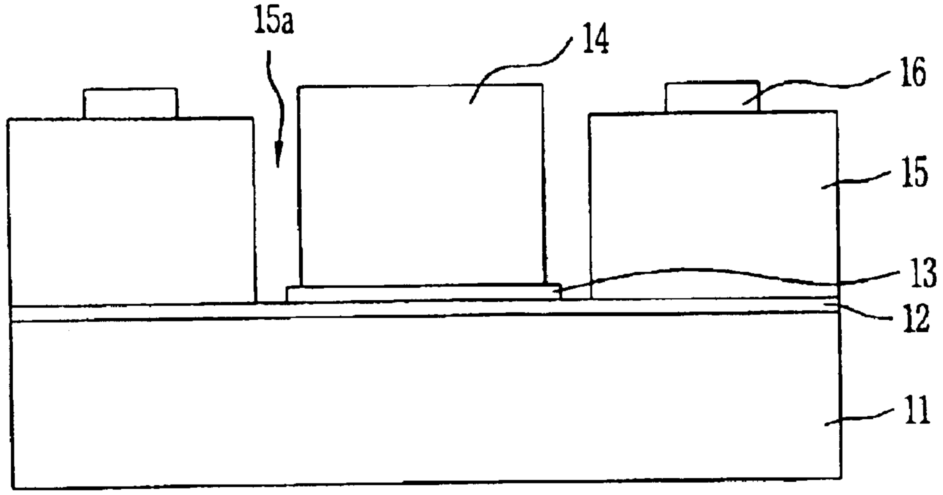
FIG. 1 is a cross-sectional view of a conventional field emission device.

The present invention will be described in detail by way of a preferred embodiment with reference to accompanying drawings, in which like reference numerals are used to identify the same or similar parts.

Figure 2:
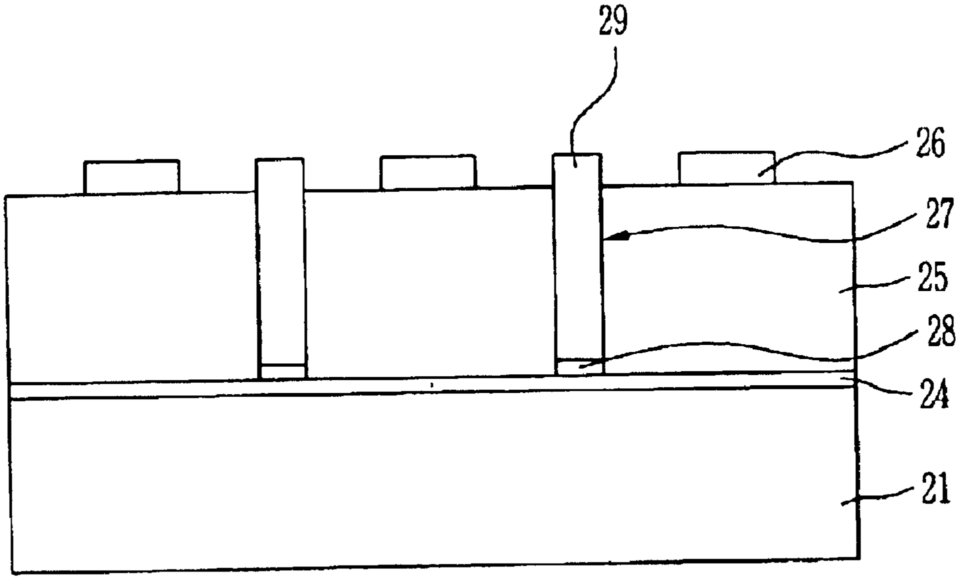
FIG. 2 is a cross-sectional view of a field emission device according to the present invention.

FIG. 2 is a cross-sectional view of a field emission device according to the present invention.

Referring now to FIG. 2, an emitter electrode 24 is formed on a silicon substrate 21. An insulating layer 25 is formed on the emitter electrode 24. A nano hole 27 having a nanometer size is formed in the insulating layer 25. A catalyst layer 28 is formed on the emitter electrode 24 exposed through the nano hole 27. An emitter 29 is formed within the nano hole 27. A gate electrode 26 is formed on the insulating layer 25 around the emitter 29.

The emitter electrode 24 is composed of an impurity region in which an impurity is implanted into the silicon substrate 21. The insulating layer 25 is formed of a low-temperature silicon oxide film or a silicon nitride film. Further, the catalyst layer 28 is made of a transition metal and is formed by means of an Electrochemical Deposition Method.

The emitter 29 is selectively formed on the catalyst layer 28 by a Chemical Vapor Deposition Method if the emitter 29 is made of either carbon nanotube or a nano grain film. On the contrary, in case of the emitter 24 is made of a metal tip, the emitter 24 is formed by an Electro-Beam Evaporation Method. The gate electrode 26 is made of a common metal or polysilicon.

A method of fabricating the field emission device formed thus will be below described.

FIG. 3*a*~FIG. 3*g* are cross-sectional views of field emission devices for describing a method of fabricating the field emission devices according to a preferred embodiment of the present invention.

Figure 3A:
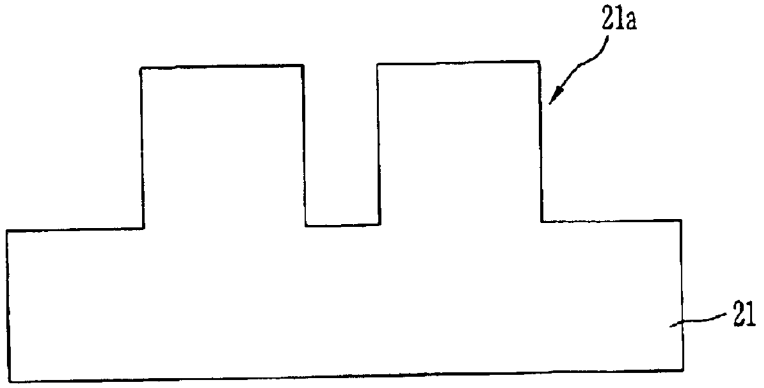
FIG. 3*a*~FIG. 3*g* are cross-sectional views of field emission devices for describing a method of fabricating the field emission devices according to a preferred embodiment of the present invention.

Referring now to FIG. 3*a*, a given region of a silicon substrate 21 is etched by a given thickness to form a protruded portion 21*a*.

Figure 3B:
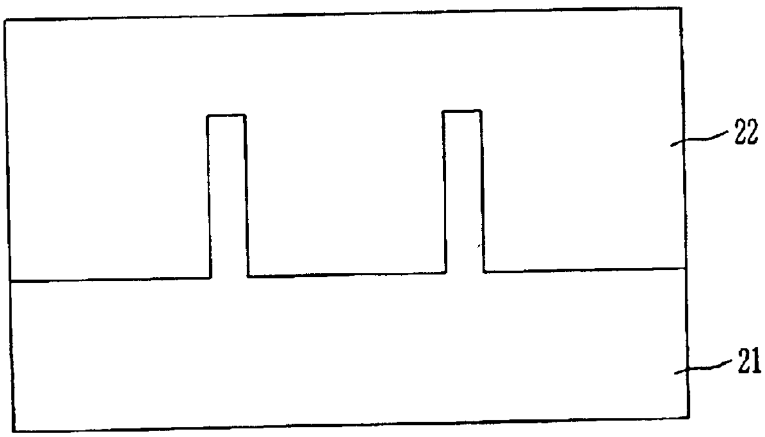

By reference to FIG. 3*b*, an oxide film 22 is grown on a surface of the silicon substrate 21 and the protruded portion 21*a* by an oxidization process. The surface of the silicon substrate 21 is changed to the oxide film 22 as the reaction of silicon with oxygen. At this time, the thickness of the protruded portion 21*a* remained can be thin to be a nanometer size by controlling the oxidation condition.

Figure 3C:
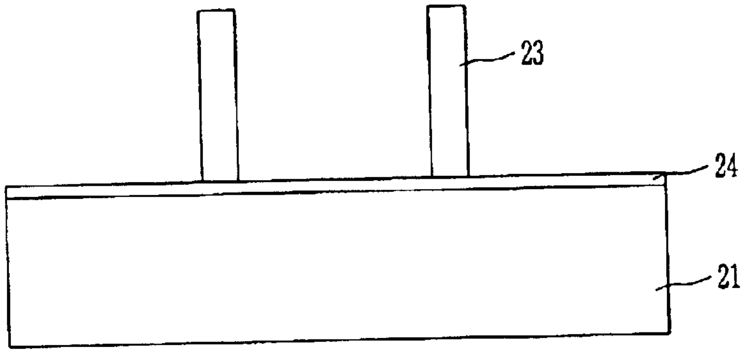

Referring now to FIG. 3*c*, the oxide film 22 is removed to form silicon rods 23 made of the protruded portion 21*a* that remains without being oxidized. Next, an n-type impurity is implanted into the silicon substrate 21, and then annealing process is performed to diffuse the impurity. Thereby, the emitter electrode 24 is formed in a surface portion of the silicon substrate 21.

Figure 3D:
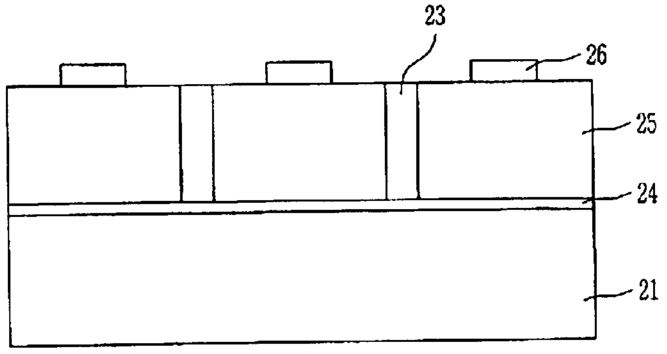

By reference to FIG. 3*d*, an insulating layer 25 is formed between the silicon rods 23. A gate electrode 26 is then formed on a given region of the insulating layer 25. The insulating layer 25 is formed to have the same height to the silicon rod 23, so that an upper surface of the silicon rod 23 is exposed. The gate electrode 26 is formed to have a given pattern so that it does not overlap with the silicon rod 23.

At this time, a self align etching method can be used to form the gate electrode 26.

The higher of the insulating layer 25 formed on the silicon rod 23 is higher than that of the insulating layer 25 formed between the silicon rod 23 by the aspect of the silicon rod 23. In this status, a conductive layer and a photoresist film (not shown) are formed on the insulating layer 25, sequentially. The photoresist film is removed by an etch back process until the conductive layer formed on the silicon rod 23 is exposed. And then the photoresist film and the conductive layer exposed are removed until the conductive layer formed between the silicon rod 23 is exposed. The gate electrode 26 composed of the conductive layer remained is formed by the above self-aligned patterning method.

The insulating layer 25 is formed of a low-temperature silicon oxide film or a silicon nitride film. The gate electrode 26 is formed of metal or polysilicon.

Figure 3E:
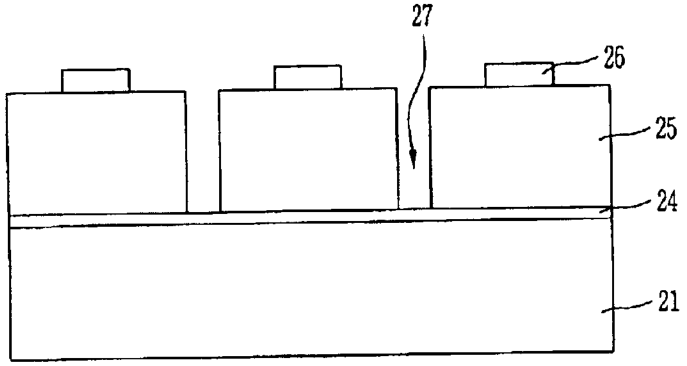

Referring now to FIG. 3*e*, the silicon rod 23 is removed by etching process. A nano hole 27 having a nanometer size is formed at a region from which the silicon rod 23 is removed. The emitter electrode 24 is exposed at the bottom of the nano hole 27.

A dry etch process or a wet etch process is performed to remove the silicon rod 23. The etching selective ratio of the insulating layer 25 and the silicon rod 23 is controlled to remove only the silicon rod 23.

Thereafter, an emitter 29 is formed within the nano hole 27. At this time, a method of forming the emitter 29 may differ depending on what material is the emitter is formed. A method of forming the emitter 29 using carbon nanotube or a nano grain film will be first described below.

Figure 3F:
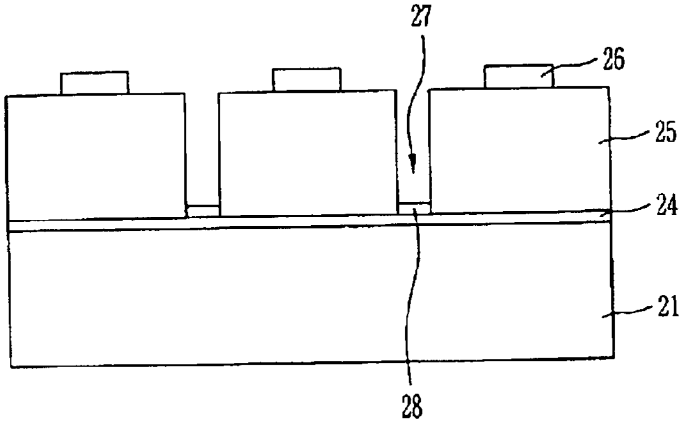

Referring now to FIG. 3*f*, if the carbon nanotube or the nano grain film is used to form the emitter 29, a catalyst layer is required to grow the carbon nanotube or the nano grain film. A catalyst layer 28 is formed on the emitter electrode 24 exposed through the nano hole 27. The catalyst layer 28 is formed by means of an Electrochemical Deposition Method, so that the catalyst layer 28 is selectively formed only on the emitter electrode 24.

Figure 3G:
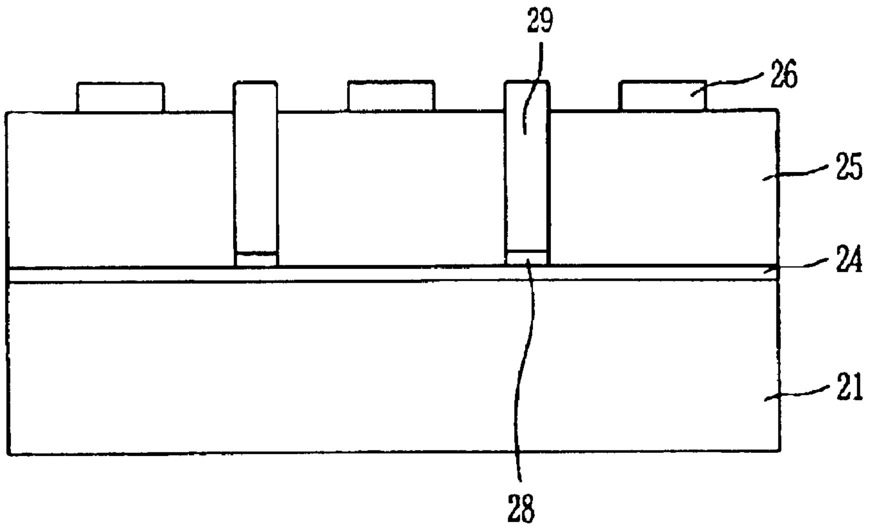

Referring now to FIG. 3*g*, the carbon nanotube or the nano grain film is formed on the catalyst layer 28 to form the emitter 29. The carbon nanotube or nano grain film is grown by means of a Chemical Vapor Deposition Method. Thereby, the triode-type field emission device can be fabricated.

As shown in FIG. 3*g*, the aspect ratio of the emitter 29 is increased since the emitter 29 is formed within the nano hole 27. Therefore, electrons can be efficiently emitted even at a low voltage level.

Meanwhile, a method of forming the emitter 29 using a metal tip will be below described by reference to FIG. 4*a* and FIG. 4*b*.

Figure 4A:
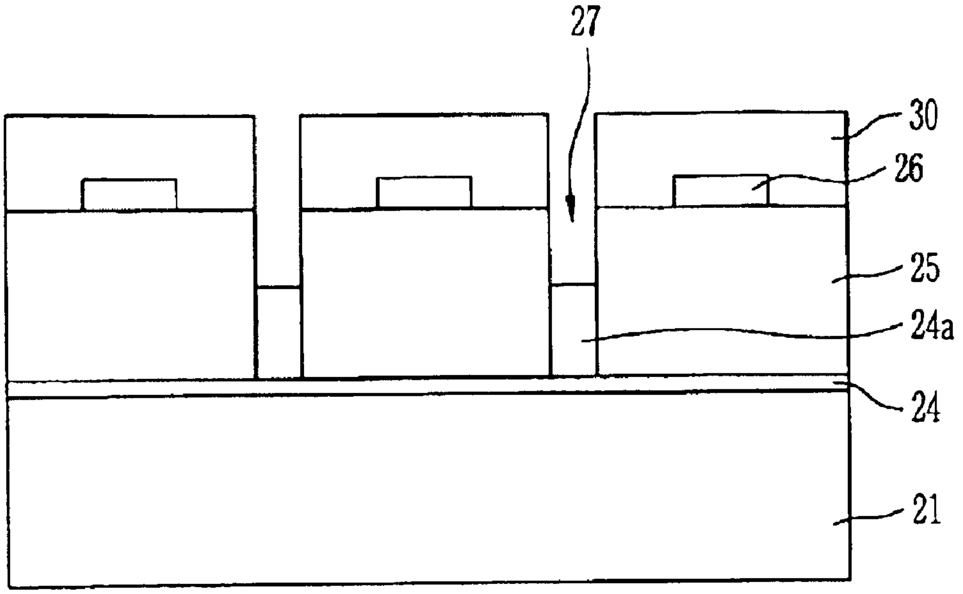
FIG. 4*a* and FIG. 4*b* are cross-sectional views of field emission devices for describing a method of fabricating the field emission devices according to another embodiment of the present invention.

Referring now to FIG. 4*a*, though not shown in the drawings, processes before FIG. 4*a* are same to those from FIG. 3*a*~FIG. 3*e*. The process before FIG. 4*a* will not be described. An emitter electrode 24 is grown to form an emitter growth layer 24*a* at the bottom of a nano hole 27. A sacrifice metal layer 30 is then formed on an insulating layer 25 and a gate electrode 26. The sacrifice metal layer 30 is made of a material that is usually made of aluminum or materials that can be lift off but do not affect other thin films. The sacrifice metal layer 30 is formed by means of an Electro-Beam Evaporation Method.

Figure 4B:
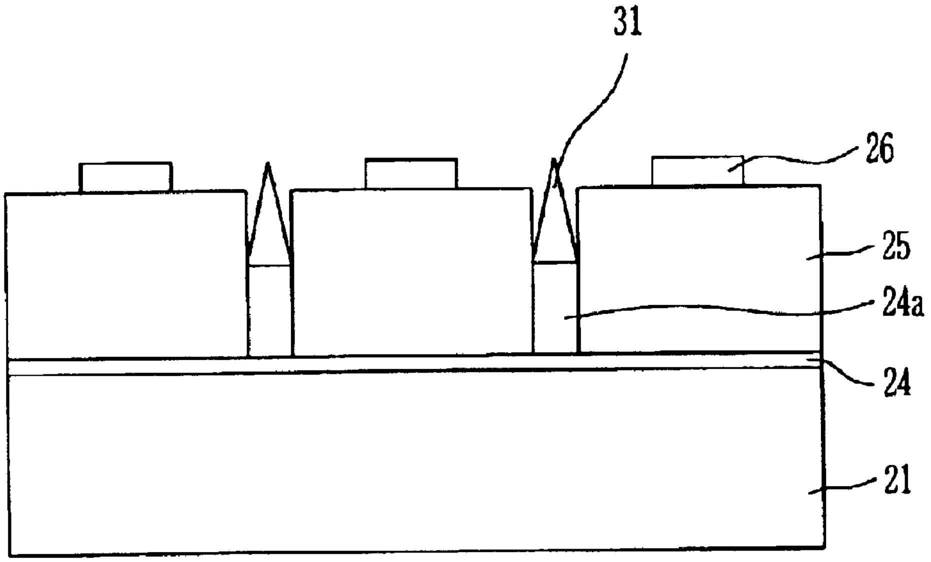

Referring now to FIG. 4*b*, metal is deposited within the nano hole 27 using a deposition apparatus having a good linearity to thus form an emitter 31. The sacrifice metal layer 30 is then removed. Thus the triode-type field emission device which can smoothly emit electrons even at a low voltage level is fabricated.

As mentioned above, the present invention includes forming a hole having a nanometer size by using common semiconductor manufacturing processes and forming an emitter within the nano hole to increase the aspect ratio of the emitter. Therefore, the present invention has outstanding advantages that it can lower the driving voltage and reduce the power consumption.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of fabricating a field emission device, comprising the steps of:

forming silicon rods on a silicon substrate;

forming an emitter electrode within said silicon substrate;

forming insulating layer between said silicon rods;

forming a gate electrode on said insulating layer;

forming a nano hole in said insulating layer by removing said silicon rods; and forming an emitter on said emitter electrode exposed through said nano hole.

2. The method as claimed in claim 1, wherein said emitter electrode is formed by the steps of:

implanting an impurity into said silicon substrate; and diffusing said impurity.

3. The method as claimed in claim 2, wherein said impurity is an N-type impurity.

4. The method as claimed in claim 1, wherein said emitter is formed by the steps of:

forming a catalyst layer on said emitter electrode exposed through said nano hole;

growing any one of carbon nanotube and a nano grain film on said catalyst layer to form emitter.

5. The method as claimed in claim 4, wherein said catalyst layer is formed by an Electrochemical Deposition Method.

6. The method as claimed in claim 1, wherein said emitter is formed by the steps of:

growing said emitter electrode exposed through said nano hole to form an emitter growth layer;

forming a sacrifice metal layer on said insulating layer and said gate electrode;

depositing metal on said emitter growth layer to form a metal tip; and removing said sacrifice metal layer.

7. The method as claimed in claim 6, wherein said sacrifice metal layer is made of aluminum or materials that can be lift off, and wherein said sacrifice metal layer is formed by an Electrochemical Deposition Method.

8. A method of fabricating a field emission device, comprising the steps of:

forming silicon rods on a silicon substrate, wherein said silicon rods are formed by the steps of etching a given region of said silicon substrate by a target thickness to form a protruded portion, oxidizing the surface of said silicon substrate and said protruded portion to form an oxide film, and removing said oxide film;

forming an emitter electrode within said silicon substrate;

forming insulating layer between said silicon rods;

forming a gate electrode on said insulating layer;

forming a nano hole in said insulating layer by removing said silicon rods; and forming an emitter on said emitter electrode exposed through said nano hole.

9. The method as claimed in claim 8, wherein said emitter electrode is formed by the steps of:

implanting an impurity into said silicon substrate; and diffusing said impurity.

10. The method as claimed in claim 9, wherein said impurity is an N-type impurity.

11. The method as claimed in claim 8, wherein said emitter is formed by the steps of:

forming a catalyst layer on said emitter electrode exposed through said nano hole;

growing any one of carbon nanotube and a nano grain film on said catalyst layer to form said emitter.

12. The method as claimed in claim 11, wherein said catalyst layer is formed by an Electrochemical Deposition Method.

13. The method as claimed in claim 8, wherein said emitter is formed by the steps of:

growing said emitter electrode exposed through said nano hole to form an emitter growth layer;

forming a sacrifice metal layer on said insulating layer and said gate electrode;

depositing metal on said emitter growth layer to form a metal tip; and removing said sacrifice metal layer.

14. The method as claimed in claim 13, wherein said sacrifice metal layer is made of aluminum or materials that can be lift off, and wherein said sacrifice metal layer is formed by an Electrochemical Deposition Method.

* * * * *